United States Patent
Yamazaki et al.

(10) Patent No.: US 6,204,519 B1
(45) Date of Patent: *Mar. 20, 2001

(54) THIN FILM SEMICONDUCTOR DEVICE

(75) Inventors: Shunpei Yamazaki, Tokyo; Toshiji Hamatani; Takeshi Fukada, both of Kanagawa, all of (JP)

(73) Assignee: Semicondutor Energy Laboratory Co., Ltd., Kanagawa-ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/813,541

(22) Filed: Mar. 7, 1997

(30) Foreign Application Priority Data

Mar. 10, 1996 (JP) .................................... 8-082012

(51) Int. Cl.⁷ .................................................. H01L 29/04
(52) U.S. Cl. ............................... 257/72; 257/59; 257/61; 257/66
(58) Field of Search .................... 257/59, 72, 66, 257/61; 438/158

(56) References Cited

U.S. PATENT DOCUMENTS

| | | | |
|---|---|---|---|
| 5,036,370 | * 7/1991 | Miyago et al. | 257/72 |
| 5,471,330 | * 11/1995 | Sarma | 349/43 |
| 5,473,168 | * 12/1995 | Kawai et al. | 257/72 |
| 5,536,932 | * 7/1996 | Hack et al. | 250/208.1 |
| 5,567,633 | * 10/1996 | Gosain et al. | 438/158 |
| 5,656,824 | * 8/1997 | Den Boer et al. | 257/72 |
| 5,805,252 | * 9/1998 | Shimada et al. | 349/113 |

FOREIGN PATENT DOCUMENTS

| | | | |
|---|---|---|---|
| 3-220529 | * 9/1991 | (JP) | 257/72 |
| 542271 | * 5/1993 | (JP) | 257/72 |
| 5-235355 | * 9/1993 | (JP) | 257/72 |
| 6-77483 | * 3/1994 | (JP) | 257/59 |
| 6-77485 | * 3/1994 | (JP) | 257/59 |

OTHER PUBLICATIONS

Aoyama et al., "Inverse Staggered Polycrystalline and Amorphous Silicon Double Structure Thin Film Transistors," Applied Physics Letters, vol. 66, No. 22, pp. 3007–3009, May 29, 1995.*

Wolf, Stanley, Silicon Processing For the VLSI Era.

Hayashi H. et al., Fabrication of Low–Temperature Bottom–Gate Poly–Si TFTs on Large–Area Substrate by Linear–Beam Excimer Laser Crystallization and Ion Doping Method, Dec. 1995, Washington, D.C.

* cited by examiner

Primary Examiner—Mahshid Saadat
Assistant Examiner—George C. Eckert, II
(74) Attorney, Agent, or Firm—Fish & Richardson P.C.

(57) ABSTRACT

A thin film semiconductor device comprising a substrate having an insulating surface, gate electrodes disposed on the insulating surface, gate insulating films disposed on upper portions of the gate electrodes, and thin film semiconductors disposed on the gate insulating films and including channel forming regions, source regions and drain regions. Two kinds of thin film semiconductor unit are disposed on the substrate. A first thin film semiconductor unit includes the thin film semiconductor of polycrystal, an insulating film covering an upper portion of the channel forming region, impurity semiconductor films doped with trivalent or pentavalent impurities and covering the source region and the drain region, and conductive films disposed on the impurity semiconductor films. A second thin film semiconductor unit includes the thin film semiconductor of amorphous, and other components similar to the first thin film semiconductor unit.

70 Claims, 6 Drawing Sheets

THIN FILM SEMICONDUCTOR DEVICE

BACKGROUND OF THE INVENTION

1. Field of the Invention

The present invention relates to a thin film semiconductor device in which a plurality of thin film semiconductors are formed on a substrate having an insulating surface, which can be applied to a liquid crystal display device and the like.

2. Description of Related Art

An active matrix liquid crystal display device is known as one of devices employing a number of thin film transistors using thin film semiconductors. The active matrix liquid crystal display device is also referred to as what is called an AMLCD (Active Matrix Liquid Crystal Display), and is classified into some types according to the materials of the thin film transistors or the structure of the transistors. Since the thin film transistor is also referred to as what is called a TFT (Thin Film Transistor), the AMLCD is also referred to as a TFT liquid crystal.

With respect to the materials, there are an amorphous TFT type using amorphous silicon as a main material, a high temperature polysilicon TFT type using polycrystal silicon formed through a high temperature process more than 1,000° C. as a main material, a low temperature polysilicon TFT type using polycrystal silicon formed through a low temperature process of 600° C. as a main material, and the like. With respect to the structure of transistors, there are a bottom-gate type in which a gate electrode is disposed at a lower side, a top-gate type in which a gate electrode is disposed at an upper side, and the like.

Although there are features in the respective materials or the structure of the transistors, in the case of the amorphous TFT, since the mobility is small and not larger than 1 cm$^2$/Vsec, in order to form a channel forming region between a gate insulating film and an active silicon layer with proper coordination, the gate insulating film and the active silicon layer must be continuously formed, and in order to prevent hydrogen in the amorphous silicon from drawing off, the amorphous silicon can not be heated up to a high temperature over 300° C. after formation thereof. Further, since the amorphous silicon has photosensitivity, it is desired to be as thin as possible, not larger than 300 Å, so that the bottom gate type reverse stagger structure is used.

Since the amorphous TFT has large resistance at an OFF-state, an OFF-state leak current is small, so that it is most suitable for a switching transistor of a pixel. However, since the mobility thereof is small, it is impossible to form a driver circuit such as a shift register on a substrate, and an external IC using crystalline silicon is always required. Accordingly, the amorphous TFT has problems in miniaturization and lowering the cost.

With respect to the high temperature TFT, since a high temperature process over 1,000° C. can be carried out, steps similar to socalled crystalline silicon can be used. Thus, a very stable process can be conducted and also the mobility thereof is about 100 cm$^2$/Vsec, a driver circuit can be formed on a substrate. However, as a substrate capable of being used at a high temperature of 1,000° C., a substrate other than an expensive substrate such as quartz can not be used, so that the enlargement of the substrate is difficult, and the application of the high temperature TFT is restricted to a view finder with a diagonal of at most two inches or the like.

The low temperature polysilicon can be formed with the merits of both the amorphous TFT and the high temperature polysilicon TFT, and it has superior properties, that is, a TFT having a high mobility can be formed on a low cost normal glass substrate. Accordingly, it is also possible to form a driver circuit on the substrate and at the same time, to form a switching transistor for a liquid crystal pixel.

However, when the low temperature polysilicon is formed, in a step of crystallizing the amorphous silicon formed on the glass substrate, it is known by experiment that when the amorphous silicon film is thin, it can not be crystallized by the formation through low temperature thermal anneal of not larger than 600° C. Particularly, when the film thickness is not larger than 300 Å, the film can be hardly crystallized. Also in the case of the low temperature polysilicon, it becomes difficult to lower an OFF-state leak current in an OFF-state if the film thickness of silicon is not made thin, so that the thickness is desired to be as thin as possible. Although the silicon film with a thickness of not less than 300 Å can be used as a driver circuit or the like by using an LDD structure, it is preferable that the thickness is not larger than 300 Å in order to use the silicon film as a switching transistor for a pixel.

In the case where the amorphous silicon with a thickness of not larger than 300 Å is crystallized, laser crystallization using a laser of a wavelength of not larger than 400 nm, such as an excimer laser, is effective. Crystallization is possible even for a film thickness of not larger than 300 Å by crystallization using a laser, and the laser crystallization is considerably used as a method of manufacturing a low temperature polysilicon TFT.

However, although crystallization by a laser is industrially possible when the substrate is small, when the substrate becomes large, crystallization of the entire surface of the substrate by a laser takes an extremely long time so that laser crystallization is not appropriate from the industrial standpoint. Further, since there is no laser device capable of annealing a large substrate at once, the entire of the substrate is crystallized by repeating partial laser crystallization. Accordingly, irregularity of laser irradiation directly causes irregularity of characteristics of TFTs.

SUMMARY OF THE INVENTION

It is therefore an object of the present invention to provide a thin film semiconductor device which combines only merits of an amorphous silicon TFT and a polysilicon TFT by using a TFT of a low temperature polysilicon using laser crystallization or the like as a driving circuit, and an amorphous silicon transistor as a switching transistor for a liquid crystal pixel, so that a thin film semiconductor unit having switching characteristics of a small OFF-state current and an ON/OFF ratio of not less than five figures is provided for the pixel, and a thin film semiconductor unit having high mobility is provided for a driver to integrate the driving circuit on a substrate.

In order to achieve the above object, according to the present invention, a thin film semiconductor device comprising a substrate having an insulating surface, gate electrodes disposed on said insulating surface, gate insulating films disposed on upper portions of said gate electrodes, and thin film semiconductors disposed on said gate insulating films and including channel forming regions, source regions and drain regions, wherein one of said gate electrodes has a first area being contact with said substrate and a second area being contact with said gate insulating film, said first area being larger than said second area, and wherein a plurality of thin film semiconductor units are disposed on said substrate, said plurality of semiconductor units comprising:

a first thin film semiconductor unit including said thin film semiconductor of polycrystal, an insulating film covering an upper portion of said channel forming region in said polycrystal thin film semiconductor, impurity semiconductor films doped with trivalent or pentavalent impurities and covering said source region and said drain region in said polycrystal thin film semiconductor, and conductive films disposed on said impurity semiconductor films, said impurity semiconductor films and said conductive films extending to said insulating film on said channel region, and being equal to each other in plane shape; and a second thin film semiconductor unit including said thin film semiconductor of amorphous, an insulating film covering said channel region in said amorphous thin film semiconductor, impurity semiconductor films doped with trivalent or pentavalent impurities and covering said source region and said drain region in said amorphous thin film semiconductor, and conductive films disposed on said impurity semiconductor films, said impurity semiconductor films and said conductive films extending to said insulating film on said channel region, and being equal to each other in plane shape.

Further, according to the present invention, a thin film semiconductor device comprising a substrate having an insulating surface, gate electrodes disposed on said insulating surface, gate insulating films disposed on upper portions of said gate electrodes, and thin film semiconductors disposed on said gate insulating films and including channel forming regions, source regions and drain regions, wherein one of said gate electrodes has a first area being in contact with said substrate and a second area being in contact with said gate insulating film, said first area being larger than said second area, wherein a plurality of thin film semiconductor units are disposed on said semiconductor, said plurality of semiconductor units comprising:

a first semiconductor unit including said thin film semiconductor of polycrystal, said channel forming region in said polycrystal thin film semiconductor having a thickness thinner than that of said source region and said drain region in said polycrystal thin film semiconductor, impurity semiconductor films doped with trivalent or pentavalent impurities and covering said source region and said drain region, and conductive films disposed on said impurity semiconductor films, said impurity semiconductor films and said conductive films being equal to each other in plane shape; and a second semiconductor unit including said thin film semiconductor of amorphous, said channel forming region in said amorphous thin film semiconductor having a thickness thinner than that of said source region and said drain region in said amorphous thin film semiconductor, impurity semiconductor films doped with trivalent or pentavalent impurities and covering said source region and said drain region, and conductive films disposed on said impurity semiconductor films, said impurity semiconductor films and said conductive films being equal to each other in plane shape.

Still further, a thin film semiconductor device comprising a substrate having an insulating surface, gate electrodes disposed on said insulating surface, gate insulating films disposed on upper portions of said gate electrodes, and thin film semiconductors disposed on said gate insulating films and having channel forming regions, source regions and drain regions, wherein one of said gate electrodes has a first area being in contact with said substrate and a second area being in contact with said gate insulating film said first area being larger than said second area, and wherein a plurality of thin film semiconductor units are disposed on said substrate, said plurality of semiconductor units comprising:

a first thin film semiconductor unit including said thin film semiconductor of polycrystal, an insulating film covering an upper portion of said channel region in said polycrystal thin film semiconductor, regions doped with trivalent or pentavalent impurities in said source region and said drain region in said polycrystal thin film semiconductor, and conductive films disposed on said regions doped with said impurities, said conductive films extending to said insulating film on said channel region; and a second thin film semiconductor unit including said thin film semiconductor of amorphous, an insulating film covering an upper portion of said channel region in said amorphous thin film semiconductor, regions doped with trivalent or pentavalent impurities in said source region and drain region in said amorphous thin film semiconductor, and conductive films disposed on said regions doped with said impurities, said conductive films extending to said insulating film on said channel region.

Still further, a thin film semiconductor device comprising a substrate having an insulating surface, gate electrodes disposed on said insulating surface, gate insulating films disposed on upper portions of said gate electrodes, and thin film semiconductors disposed on said gate insulating films and having channel forming regions, source regions and drain regions, wherein one of said gate electrodes has a first area being in contact with said substrate and a second area being in contact with said gate insulating film said first area being larger than said second area, and wherein a plurality of thin film semiconductor units are disposed on said substrate, said plurality of semiconductor units comprising:

a first thin film semiconductor unit including said thin film semiconductor of polycrystal, said thin film semiconductor composed of a channel region, a drain region, a source region, a lightly doped source region, and a lightly doped drain region, a first insulating film covering said channel region, said lightly doped source region, and said lightly doped drain region, a second insulating region on said first insulating film and over said channel region, and regions doped with trivalent or pentavalent impurities in said source region, said drain region, said lightly doped source region, and lightly doped drain region, the dose amount of said impurities in said source region and said drain region being larger than that of said impurities of said lightly doped source region and said lightly doped drain region; and a second thin film semiconductor unit including said thin film semiconductor of amorphous, an insulating film made of the same material as said second insulating film, having the same thickness as said second insulating film, and covering an upper portion of said channel region in said amorphous thin film semiconductor, regions doped with trivalent or pentavalent impurities in said source region and drain region in said amorphous thin film semiconductor, and conductive films disposed on said regions doped with said impurities, said conductive films extending to said insulating film on said channel region. Still further, a thin film semiconductor device comprising a substrate having an insulating surface, gate electrodes disposed on said insulating surface, gate insulating films disposed on upper portions of said gate electrodes, and thin film semiconductors disposed on said gate insulating films and having channel forming regions, source regions and drain regions, wherein one of said gate electrodes has a first area being contact with said substrate and a second area being contact with said gate insulating film said first area being larger than said second area, and wherein a plurality of thin film semiconductor units are disposed on said substrate, said plurality of semiconductor units comprising:

a first thin film semiconductor unit including said thin film semiconductor of polycrystal, said thin film semiconductor composed of a channel region, a drain region, a source region, a lightly doped source region, and a lightly doped drain region, a first insulating film covering said channel region, a second insulating film on said lightly doped source region, said lightly doped drain region, and said first insulating film, and regions doped with trivalent or pentavalent impurities in said source region, said drain region, said lightly doped source region, and lightly doped drain region, the dose amount of said impurities in said source region and said drain region being larger than that of said impurities of said lightly doped source region and said lightly doped drain region; and a second thin film semiconductor unit including said thin film semiconductor of amorphous, an insulating film made of the same material as said second insulating film, having the same thickness as said second insulating film, and covering an upper portion of said channel region in said amorphous thin film semiconductor, regions doped with trivalent or pentavalent impurities in said source region and said drain region in said amorphous thin film semiconductor, and conductive films disposed on said regions doped with said impurities, said conductive films extending to said insulating film on said channel region.

Still further, a method of manufacturing a thin film semiconductor device comprising a substrate having an insulating surface, gate electrodes disposed on said insulating surface, gate insulating films disposed on upper portions of said gate electrodes, and thin film semiconductors disposed on said gate insulating films and including channel forming regions, source regions and drain regions, said method comprising the steps of:

forming a gate electrode film of metal on said substrate;

forming a gate insulating film on said gate electrode film under a low pressure;

forming an amorphous semiconductor thin film on said gate insulating film under a low pressure without exposing said gate insulating film to the atmosphere;

crystallizing a part of said amorphous semiconductor thin film without exposing said amorphous semiconductor thin film to the atmosphere;

forming an etching stopper insulating film on said semiconductor thin film without exposing said semiconductor thin film to the atmosphere;

taking out said substrate into the atmosphere;

forming an etching stopper insulating film on said channel forming region;

shaping said thin film semiconductor and said gate insulating film into a desired shape, forming a semiconductor film containing trivalent or pentavalent impurities;

forming a conductive film on said semiconductor film; and shaping said semiconductor film containing said impurities and said conductive film into the same plane shape;

whereby a thin film semiconductor unit in which said channel forming region is made of polycrystal, and a thin film semiconductor unit in which said channel forming region is made of amorphous, are formed on said substrate.

Still further, a method of manufacturing a thin film semiconductor device comprising a substrate having an insulating surface, a gate electrode disposed on said insulating surface, a gate insulating film disposed on an upper portion of said gate electrode, and a thin film semiconductor disposed on said gate insulating film and including a channel forming region, a source region and a drain region, said method comprising the steps of:

forming a gate electrode film of metal on said substrate;

forming a gate insulating film on said gate electrode film under a low pressure;

forming an amorphous semiconductor thin film on said gate insulating film under a low pressure without exposing said gate insulating film to the atmosphere;

crystallizing a part of said semiconductor thin film without exposing said semiconductor thin film to the atmosphere; forming a semiconductor film containing trivalent or pentavalent impurities on said semiconductor thin film without exposing said semiconductor thin film to the atmosphere;

forming a conductive film on said semiconductor film containing said impurities without exposing said semiconductor film to the atmosphere;

taking out said substrate into the atmosphere; and shaping said conductive film, said semiconductor film containing said impurities, and a part of said semiconductor thin film into a desired shape;

whereby a thin film semiconductor unit in which said channel forming region is made of polycrystal, and a thin film semiconductor unit in which said channel forming region is made of amorphous, are formed on said substrate.

Still further, a method of manufacturing a thin film semiconductor device comprising a substrate having an insulating surface, a gate electrode disposed on said insulating surface, a gate insulating film disposed on an upper portion of said gate electrode, and a thin film semiconductor disposed on said gate insulating film and including a channel forming region, a source region and a drain region, said method comprising the steps of:

forming a gate electrode film of metal on said substrate;

forming a gate insulating film on said gate electrode film under a low pressure;

forming an amorphous semiconductor thin film on said gate insulating film under a low pressure without exposing said gate insulating film to the atmosphere;

crystallizing a part of said semiconductor thin film without exposing said semiconductor thin film to the atmosphere;

forming an etching stopper insulating film on said semiconductor thin film without exposing said semiconductor thin film to the atmosphere;

taking out said substrate into the atmosphere;

forming an etching stopper insulating film on said channel forming region;

shaping said thin film semiconductor and said gate insulating film into a desired shape;

forming said source region and said drain region by doping of trivalent or pentavalent impurities; and forming a conductive film on said source region and said drain region such that at least part of said conductive film is brought into contact with said source region and said drain region;

whereby a thin film semiconductor unit in which said channel forming region is made of polycrystal, and a thin film semiconductor unit in which said channel forming region is made of amorphous, are formed on said substrate.

Still further, a method of manufacturing a thin film semiconductor device comprising a substrate having an insulating surface, a gate electrode disposed on said insulating surface, a gate insulating film disposed on an upper portion of said gate electrode, and a thin film semiconductor disposed on said gate insulating film and including a channel forming region, a source region and a drain region, said method comprising the steps of:

forming a gate electrode film of metal on said substrate;

forming a gate insulating film on said gate electrode film under a low pressure;

forming an amorphous semiconductor thin film on said gate insulating film under a low pressure without exposing said gate insulating film to the atmosphere;

crystallizing a part of said semiconductor thin film without exposing said semiconductor thin film to the atmosphere;

forming a first insulating film on said semiconductor thin film without exposing said semiconductor thin film to the atmosphere;

taking out said substrate into the atmosphere;

shaping said first insulating film so that said first insulating film having an area larger than said gate electrode remains on said crystallized semiconductor thin film, and said first insulating film does not remain on said semiconductor thin film not crystallized;

forming a second insulating film having an area smaller than said gate electrode on said first insulating film on said crystallized semiconductor thin film and on said semiconductor thin film not crystallized;

forming said source region, said drain region, said lightly doped source region, and said lightly doped drain region in said crystallized semiconductor thin film, and forming said source region and said drain region in said semiconductor thin film not crystallized, by doping of trivalent or pentavalent impurities; and recrystallizing only said crystallized semiconductor thin film;

whereby a thin film semiconductor unit in which said channel forming region is made of polycrystal, and a thin film semiconductor unit in which said channel forming region is made of amorphous, are formed on said substrate.

Still further, a method of manufacturing a thin film semiconductor device comprising a substrate having an insulating surface, a gate electrode disposed on said insulating surface, a gate insulating film disposed on an upper portion of said gate electrode, and a thin film semiconductor disposed on said gate insulating film and including a channel forming region, a source region and a drain region, said method comprising the steps of:

forming a gate electrode film of metal on said substrate;

forming a gate insulating film on said gate electrode film under a low pressure;

forming an amorphous semiconductor thin film on said gate insulating film under a low pressure without exposing said gate insulating film to the atmosphere;

crystallizing a part of said semiconductor thin film without exposing said semiconductor thin film to the atmosphere;

forming a first insulating film on said semiconductor thin film without exposing said semiconductor thin film to the atmosphere;

taking out said substrate into the atmosphere;

shaping said first insulating film so that said first insulating film having an area smaller than said gate electrode remains on said crystallized semiconductor thin film, and said first insulating film covers all of said channel forming region, said drain region, and said source region on said semiconductor thin film not crystallized;

conducting light doping of trivalent or pentavalent impurities so that a region not covered with said first insulating film is lightly doped, and said semiconductor thin film not crystallized is hardly doped;

recrystallizing only said crystallized semiconductor thin film;

forming a second insulating film having an area larger than said gate electrode on said first insulating film on said crystallized semiconductor thin film and forming said second insulating film having an area smaller than said gate electrode on said semiconductor thin film not crystallized;

forming said source region, said drain region, said lightly doped source region, and said lightly doped drain region in said crystallized semiconductor thin film, and forming said source region and said drain region in said semiconductor thin film not crystallized, by doping of trivalent or pentavalent impurities; and recrystallizing only said crystallized semiconductor thin film;

whereby a thin film semiconductor unit in which said channel forming region is made of polycrystal, and a thin film semiconductor unit in which said channel forming region is made of amorphous, are formed on said substrate.

In order to form polycrystal silicon (polysilicon) transistors and noncrystal silicon (amorphous silicon) transistors on the same substrate, a bottom gate type and reverse stagger type structure is adopted in the present invention. The reason is as follows. That is, particularly in the case of an amorphous silicon TFT, since an interface between a gate insulating film and an amorphous silicon as an active layer becomes a channel, it is continuously formed and the gate insulating film is formed at a temperature as high as possible to form a dense film. Thus, if the amorphous silicon is formed before the gate insulating film is formed, hydrogen in the amorphous silicon is drawn off, so that the function as a semiconductor is lost. Accordingly, the gate insulating film is formed at a high temperature in advance, and then the amorphous silicon as an active layer is formed.

As a gate electrode, any film may be used as long as it is a metal film. In the present invention, Al, Ta, Cr, Mo, or alloy containing the former metal as a main component is used. As a film forming method, magnetron sputtering, electron beam evaporation, or resistor heating evaporation is used. In view of heat resistance at subsequent laser crystallization, and to prevent short circuit between a source or drain and a gate, it is effective to cover the gate electrode with a dense oxide film by anodic oxidation of the metal as mentioned above. The shape of the gate electrode greatly affects subsequent processes. Especially, since the film thickness of silicon is thin, the edge of the gate electrode is required to be taper-shaped, and it is necessary to form such a taper shape that an area of the gate electrode being contact with the gate insulating film is smaller than an area of the gate electrode being contact with the substrate.

In the case where Al is used for the metal film, by application of heat of not lower than 200° C. at a subsequent film formation of the gate insulating film or the like, hillocks are sometimes produced. The generation of hillocks can be prevented by forming a film of Al mixed with Si or Sc of 0.1 to 2% as impurities, or by performing high vacuum aluminum film formation under a pressure of not larger than $10^{-7}$ Torr by evacuation before formation of an Al film. Although the film thickness is also dependent on a resistance value, it is necessary to make such a thickness that the sheet resistance becomes about 10 Ω/• or less.

After forming the gate electrode of only a metal film or a metal film covered with an anodic oxidation film, an insulating film as a gate insulating film is formed. As the insulating film, a single layer or multilayer of silicon oxide, silicon nitride, silicon nitride oxide is formed.

As a film forming method, reactive sputtering, plasma CVD, low pressure CVD, or the like is used. Since the insulating film is used as the gate insulating film, it is necessary to make the film dense by forming the film at a temperature as high as possible.

As the gate insulating film used for an amorphous TFT for switching a liquid crystal pixel, it has been found by experiment that a nitride film is superior in coordination to an oxide film. Accordingly, as the gate insulating film, a single layer of nitride film or multilayer structure in which only a layer being contact with the amorphous silicon is a nitride film, is good as the structure. Although the film thickness of the gate insulating film is dependent on the dielectric constant, the thickness of about 1,000 to 3,000 Å is required.

After forming the gate insulating film, amorphous silicon to be formed into an active layer is formed without exposing the surface thereof to the atmosphere. As a method of forming the amorphous silicon, plasma CVD method, sputtering method, low pressure CVD method, or the like is used. Although the amorphous silicon can be formed in the same reactive chamber as that where the gate insulating film has been formed, in view of the contamination of an interface between the gate insulating film to be made into the channel formation region and the amorphous silicon film, it is desirable to form the amorphous silicon in a different reactive chamber. Although it is preferable that the film thickness is as thin as possible, the thickness of not smaller than 100 Å is required in view of subsequent crystallization, and in view of OFF-state leak current of a TFT, the thickness is preferably not larger than 300 Å. Accordingly, the thickness is selected within the range of 100 to 300 Å.

After forming the amorphous silicon, to form a driving circuit or the like on the substrate, it is necessary to crystallize only a portion where polysilicon is subsequently required. In the substrate where the amorphous silicon has been formed, portions where driver circuits for driving liquid crystal are two portions, in the lengthwise and widthwise directions, of the end of the substrate. In order to crystallize those portions, laser crystallization by scanning only those portions with a laser beam, or lamp annealing to only those portions is carried out.

In the case of crystallization by a laser, since the amorphous silicon film is thin, in order to make the influence to the gate insulating film and the gate electrode as the under layer of the amorphous silicon film as little as possible, annealing is carried out by an excimer laser having a wavelength of 308 nm or 254 nm. Alternatively, lamp heating using the principle of rapid thermal anneal is preferable.

In order to carry out partial crystallization, in the case of a laser, the shape of a laser beam is made linear by an optical system, and the portion in the lengthwise direction of the substrate is irradiated at once or in a divided manner to be crystallized. Then the substrate is rotated by 90°, and the portion in the widthwise direction of the substrate is irradiated at once or in a divided manner to be crystallized. Although it is possible to scan the optical system of the laser by using a galvanometer or the like without rotating the substrate, since the optical system taking the aberration into consideration becomes complicated because of the short wavelength, it is preferable to fix the laser beam and to move the substrate instead.

In the case where partial crystallization is made by lamp annealing, the portion on the substrate where crystallization is not carried out is covered with a mask of metal or ceramics, and the lamp irradiates the entire surface of the substrate. According to experiments by the present inventor, when a metal mask was repeatedly used many times, there occurred such a problem that the mask was bent. Thus, ceramics was used as the mask. However, when a mask is not continuously used, a metal mask may be used.

In the case of crystallization, it is preferable to carry out the crystallization in vacuum or an inert gas than in the atmosphere. In the present invention, after forming the amorphous silicon, the substrate is transferred into a low pressure chamber for crystallization without exposing the substrate to the atmosphere, and crystallization is carried out in the vacuum state.

After forming the amorphous silicon and the polysilicon on the same substrate, source and drain regions are formed. There are some methods of forming the regions.

According to a first method, an insulating film for an etching stopper is provided on an upper portion of a channel forming region. The insulating film for the etching stopper is formed on the entire surface of the substrate where partial crystallization is completed. The film is also formed on the amorphous silicon and the crystallized polysilicon without exposing the substrate to the atmosphere. As the material of the film, any material may be used as long as the insulating film has a high selective ratio of etching to the silicon, and silicon nitride, silicon oxide, silicon nitride oxide may be used.

When the insulating film for the etching stopper is formed so that an area thereof is smaller than an area of an upper portion of the gate electrode, the area of the etching stopper is equivalent to the area of the channel. After forming the insulating film, the surfaces of the amorphous silicon and polysilicon, which becomes the source and drain regions, are exposed, and the channel forming portion is covered with the etching stopper.

Next, an amorphous impurity semiconductor layer which is doped with trivalent or pentavalent impurities such as phosphorous and boron, is formed on the entire surface, and a conductive layer as a wiring layer is continuously formed. Thereafter, the conductive layer and the impurity semiconductor layer are formed using the same photo mask so that they extends to an upper portion of the etching stopper and cover the source region and drain region. Thus, a silicon TFT and a polysilicon TFT are completed.

Although the amorphous silicon TFT is almost completed by the process described above, in the case of the polysilicon TFT, since the impurity semiconductor being contact with the source and drain regions is not crystalline semiconductor, if crystallization like the former partial crystallization is carried out after forming the impurity semiconductor layer, more completed TFT is made. When the present invention is applied to the AMLCD, although the amorphous silicon TFTs are only N-channel TFTs, in the case of the polysilicon TFTs, since complementary transistors are required to be formed, the impurity semiconductor film doped with boron while unnecessary portions are masked, is formed so that P-channel TFTs are formed.

According to a second method, a part of channel formation region is etched. After completing partial crystallization, a semiconductor layer doped with impurities is formed without exposing the substrate to the atmosphere, and thereafter a conductive film as a wiring layer is formed without exposing the substrate to the atmosphere.

Thereafter, the conductive film and the semiconductor layer doped with impurities are etched into the same plane shape to form a wiring region. At that time, a portion of the silicon thin film as the active layer on the gate electrode is etched, so that a channel forming region is formed. Accordingly, the film thickness of the active layer of the channel forming region is thinner than the source and drain regions.

Although the amorphous silicon TFT is almost completed by the method described above, in the case of the polysilicon TFT, since the impurity semiconductor being contact with the source and drain regions is not crystalline semiconductor, if crystallization like the former partial crystallization is carried out after forming the impurity semiconductor layer, more completed TFT is made. Although the amorphous silicon TFTs are only N-channel TFTs, in the case of the polysilicon TFTs, since complementary transistors are required to be formed, the impurity semiconductor film doped with boron while unnecessary portions are masked, is formed, so that P-channel TFTs are formed.

According to a third method, instead of forming an impurity semiconductor layer, plasma doping, ion implantation, ion doping, or the like is carried out to source and drain regions, so that the source and drain region can be formed.

Further, the polysilicon TFT can be made into an LDD structure. By forming a lightly doped drain region and a lightly doped source region having dose amounts of impurity smaller than a source region and a drain region, the LDD structure can be formed.

In the thus formed polysilicon TFTs and amorphous silicon TFTs on the same substrate, when the polysilicon TFTs are used as a driving circuit, the circuit having high frequency response characteristics can be formed, and at the same time, when the amorphous silicon TFTs are used for pixels, switching elements having high ON/OFF ratio and small OFF-state leak current can be formed. Accordingly, high quality liquid crystal display is possible. Further, since circuits can be formed on the same substrate of the cheap normal glass, the present invention has great advantages in technology.

DETAILED DESCRIPTION OF THE INVENTION

First Embodiment

A manufacturing method of forming polysilicon TFTs and amorphous silicon TFTs on the same substrate using the present invention will be described.

Figure 1A:
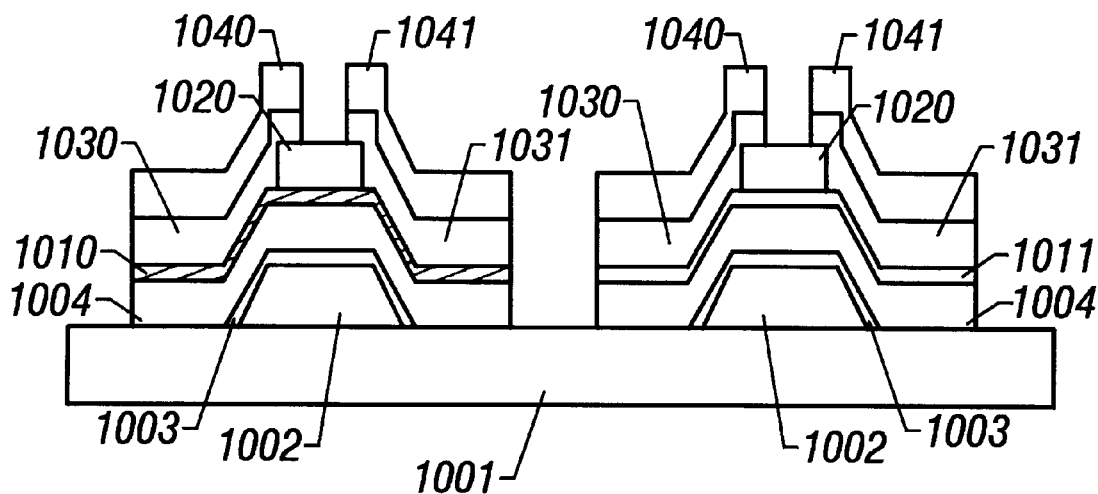
FIGS. 1(A) and 1(B) are views showing transistors of the present invention.

FIG. 1(A) shows a first embodiment of the present invention. A substrate 1001 has an insulating surface and it is made of an insulator such as soda glass, borosilicate glass or quartz, one coated with a PSG film, silicon oxide film, or silicon nitride film, or the like. This embodiment uses a substrate made of 7059 glass produced by Corning Co., Ltd. as the borosilicate glass, coated with a silicon oxide film by sputtering.

After forming a conductive film for a gate electrode 1002 on the substrate 1001, it is formed into a desired shape by using a photolithographic technique to obtain the gate electrodes 1002. At this formation, since a subsequently formed active layer is thin to be 100 to 300 Å, the gate electrode must be formed so that the cross section thereof is taper-shaped as shown in the drawing. As the material of the gate electrode 1002, there is used metal such as tantalum, chromium, molybdenum, or aluminum. If possible, it is preferable to use such metal that the surface thereof can be subjected to anodic oxidization using an anodic oxidation technique. In this embodiment, after forming an aluminum film, a gate AO film 1003 is formed by the anodic oxidation.

Although the anodic oxidation film is not necessarily required, in view of heat resistance in subsequent laser crystallization or the like and to prevent a leak between a gate electrode and a drain or source of the amorphous silicon TFT, it is preferable to carry out the anodic oxidation.

When an aluminum film is formed, since a subsequent heat process is apt to cause hillocks so that the leak between the gate electrode and the drain or source is easily generated, the film formation must be inventively conducted.

When a pure aluminum film is formed under a background pressure by sufficient evacuation before the film is formed, the hillocks are hard to be generated. Thus, before the film is formed, if the film formation is carried out after the pressure is made not larger than $10^{-7}$ Torr, the generation of hillocks can be greatly reduced. Also, if silicon or scandium of about 0.1 to 2% is mixed into aluminum, the generation of hillocks can be greatly reduced.

In this embodiment, the aluminum film is formed by using an ultra high vacuum sputtering apparatus to prevent the hillocks from being generated. In this sputtering apparatus, all inner walls of a film forming chamber are subjected to electrolytic polishing, and a turbo molecular pump and a cryopump are provided to make the background pressure not larger than $10^{-7}$ Torr, so that the background pressure can be reduced to about $5\times10^{-8}$ Torr. Further, an argon gas to be introduced is used after refining at a use point of the apparatus. Although the film thickness of the gate electrode 1002 is about 1,000 to 3,000 Å, the film thickness of 500 Å is sufficient for aluminum which requires such a film thickness that a sheet resistance is not larger than 1 Ω/•. However, in order to further reduce the resistance, the film thickness in this embodiment is 1,500 Å.

After forming the gate electrode 1002 and the gate AO film 1003, a gate insulating film 1004 is formed. As the gate insulating film 1004, there is used a single layer or a multilayer of a silicon nitride film, silicon oxide film, or silicon nitride oxide film. As a film forming method, a plasma CVD method is used. In this embodiment, the silicon nitride film is formed by a parallel flat plate plasma CVD method. The film thickness of the gate insulating film 1004 is comparable to or larger than that of the gate electrode 1002. In this embodiment, the silicon nitride film of 3,000 Å is formed.

After forming the gate insulating film 1004, an amorphous silicon film as an active layer for forming a channel forming region and source and drain regions is formed. Unless the amorphous silicon film is formed without exposing it to the atmosphere after the formation of the gate insulating film 1004, a number of interface states are generated in the interface between the gate insulating film 1004 and the active layer so that a superior transistor can not be formed. Accordingly, continuous film formation of forming a film without breaking a vacuum is important.

As methods of forming the active layer, there are a plasma CVD method, a low pressure CVD method, a photo CVD method, a sputtering method, and the like. In this embodiment, the sputtering method is used. In the sputtering, reactive sputtering by a mixture gas of argon and hydrogen is carried out, so that the amorphous silicon film of 100 to 300 Å is formed as the active layer. This is because when the thickness is not larger than 100 Å, crystallization by a laser or the like is hard, and when the thickness is not less than 300 Å, an OFF-state leak current of the TFT becomes large. In this embodiment, the amorphous silicon film of about 200 Å is formed by the reactive sputtering.

After forming the active layer, portions where polysilicon TFTs are required for subsequent formation of driving circuits or the like are crystallized. The active layer is partially crystallized by irradiation of an excimer laser having a wavelength of not larger than 400 nm such as an ArF or XeCl excimer laser, so that a polysilicon active layer 1010 and an amorphous active layer 1011 not crystallized are formed. Since it has been found by experiment that when laser crystallization is carried out in a vacuum or hydrogen gas, superior crystal can be obtained. Accordingly, in this embodiment, crystallization is carried out in the vacuum of $10^{-5}$ Torr by the irradiation of the KrF excimer laser (wavelength 248 nm, pulse width 20 nsec). The energy density of the laser is 300 mJ/cm² and ten shots are carried out.

Although heating of the substrate 1001 at the laser crystallization is effective for obtaining superior crystallization, if the substrate is heated up to an excessively high temperature, hydrogen in the amorphous active layer 1011 is drawn off. Accordingly, the crystallization is preferably carried out at a temperature of not larger than 300° C. In this embodiment, the crystallization is carried out in the state where the substrate 1001 is heated up to 150° C.

After the crystallization is completed, an insulating film as an etching stopper 1020 is formed without exposing the substrate to the atmosphere. Any insulating films may be used as long as they assure a selective ratio with respect to silicon at subsequent etching. Silicon oxide, silicon nitride, silicon nitride oxide, or the like is used. In this embodiment, the silicon nitride film of 1,000 Å by the plasma CVD method is formed.

After forming the insulating film for the etching stopper 1020, the substrate 1001 is taken out into the atmosphere. With respect to the substrate 1001 taken out into the atmosphere, the insulating film for the etching stopper 1020 is etched by a photolithographic technique to form the etching stopper 1020. This etching stopper 1020 determines a channel forming region of the TFT. As shown in the drawing, the etching stopper is formed so that the width thereof is narrower than that of the gate electrode 1002. Next, by using the photolithographic technique, the active layers 1010 and 1011, and the gate insulating film 1004 are formed into desired shapes. In this embodiment, although the active layers 1010 and 1011 and the gate insulating film 1004 are formed into the same shape, it is absolutely unnecessary to form them into the same shape.

Next, an impurity semiconductor layer for source and drain regions and a wiring layer are formed. The impurity semiconductor layer is formed by the plasma CVD method or low pressure CVD method using a mixture gas of a source gas for silicon and a trivalent or pentavalent impurity gas such as boron or phosphorous. Thereafter, a conductive film for the wiring layer is formed. As the conductive film, a metal film or a transparent conductive oxide film of ITO or the like is used. After forming the impurity semiconductor layer and the wiring layer, by using the photolithographic technique, a source region 1030, a drain region 1031, a source electrode 1040, and a drain electrode 1041 are formed so that the state shown in FIG. 1(A) is obtained.

The left side in FIG. 1(A) is the polysilicon TFT, and the right side thereof is the amorphous silicon TFT. Although they are formed to be adjacent to each other in the drawing, the polysilicon TFT is practically formed on a portion of the substrate where a driving circuit is formed, and the amorphous TFT is formed on a portion thereof where a switching element for a pixel is formed.

Figure 1B:
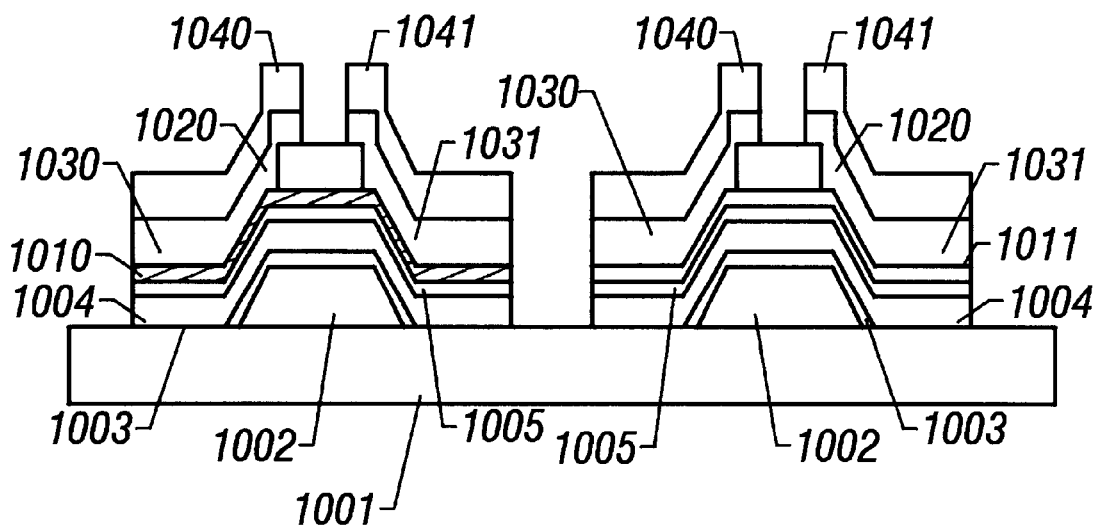

FIG. 1(B) shows a modified embodiment almost equal to FIG. 1(A) in the process and structure. Reference numerals in FIG. 1(B) correspond to those in FIG. 1(A). The only difference is that a gate insulating film is formed of two layers, that is, a first gate insulating film 1004 and a second gate insulating film 1005 are provided.

Although it has been found by experiment that in the amorphous silicon TFT, a silicon nitride film is preferable as the gate insulating film being contact with the channel forming region made of amorphous silicon. However, since the relative dielectric constant of the silicon nitride film is about two times as large as that of the silicon oxide film, the thickness thereof becomes thick. Thus, when only the portion being contact with the amorphous silicon is formed of the silicon nitride film, and other portion is formed of the silicon oxide film, the film thickness of the entire gate insulating film can be made thin.

In this modified embodiment, the silicon oxide film of 1,000 Å is formed as the first gate insulating film 1004 by the plasma CVD method using an organic silane, and the silicon nitride film of 50 Å is formed as the second gate insulating film 1005 by the plasma CVD method using a mixture gas of silane, ammonium and nitrogen

Second Embodiment

A manufacturing method of forming polysilicon TFTs and amorphous silicon TFTs on the same substrate by using the present invention will be described.

Figure 2A:
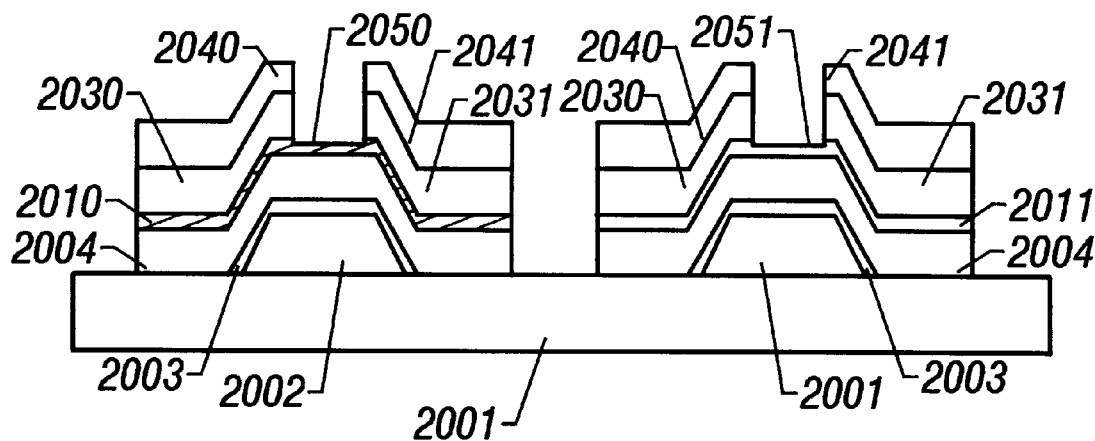
FIGS. 2(A) and 2(B) are views showing transistors of the present invention.

FIG. 2(A) shows a second embodiment of the present invention. A substrate 2001 has an insulating surface and it is made of an insulator such as soda glass, borosilicate glass or quartz, one having a coating film of PSG, silicon oxide or silicon nitride on the insulator, or the like. This embodiment uses a substrate made of 1737 glass produced by Corning Co., Ltd. as the borosilicate glass, coated with a silicon nitride film by the low pressure CVD.

After forming a conductive film for a gate electrode 2002 on the substrate 2001, it is formed into a desired shape by using a photolithographic technique to obtain the gate electrodes 2002. At this formation, since a subsequently formed active layer is thin to be 100 to 300 Å, the gate electrode must be formed so that the cross section thereof is taper-shaped as shown in the drawing. As the material of the gate electrode 2002, there is used metal such as tantalum, chromium, molybdenum, or aluminum. If possible, it is preferable to use such metal that the surface thereof can be subjected to anodic oxidation using an anodic oxidation technique. In this embodiment, after forming a tantalum film, a gate AO film 2003 is formed by the anodic oxidation.

Although the anodic oxidation film is not necessarily required, in view of heat resistance in subsequent laser crystallization or the like and to prevent a leak between a gate electrode and a drain or source of the amorphous silicon TFT, it is preferable to carry out the anodic oxidation.

Although the film thickness of the gate electrode 2002 is about 1,000 to 3,000 Å, the thickness of 1,500 Å is sufficient for tantalum which requires such a film thickness that a sheet resistance is not larger than 1 $\Omega/\square$. However, in order to further reduce the resistance, the film thickness in this embodiment is 2,000 Å.

After forming the gate electrode 2002 and the gate AO film 2003, a gate insulating film 2004 is formed. As the gate insulating film 2004, there is used a single layer or a multilayer of a silicon nitride film, silicon oxide film, or silicon nitride oxide film. As a film forming method, a plasma CVD film is used. In this embodiment, the silicon nitride film is formed by a parallel flat plate plasma CVD method. The film thickness of the gate insulating film is comparable to or larger than that of the gate electrode 2002. In this embodiment, the silicon nitride film of 3,000 Å is formed.

After forming the gate insulating film 2004, an amorphous silicon film as an active layer for forming a channel forming region and source and drain regions is formed. Unless the amorphous silicon film is formed without exposing it to the atmosphere after the formation of the gate insulating film 2004, a number of interface states are generated in the interface between the gate insulating film 2004 and the active layer so that a superior transistor can not be formed. Accordingly, continuous film formation of forming a film without breaking a vacuum is important.

As methods of forming the active layer, there are a plasma CVD method, a low pressure CVD method, a photo CVD method, a sputtering method, and the like. In this embodiment, the plasma CVD method is used. The plasma CVD method is carried out using a silane gas to form the amorphous silicon layer with a thickness of 100 to 300 Å as the active layer. This is because when the thickness is not larger than 100 Å, crystallization by a laser or the like is hard, and when the thickness is not less than 300 Å, an OFF-state leak current of the TFT becomes large. In this embodiment, the amorphous silicon film of about 200 Å is formed by the plasma CVD method.

After forming the active layer, portions where polysilicon TFTs are required for subsequent formation of driving circuits or the like are crystallized. The active layer is partially crystallized by irradiation of an excimer laser having a wavelength of not larger than 400 nm such as an ArF or KrF excimer laser, so that a polysilicon active layer 2010 and an amorphous active layer 2011 not crystallized are formed. Since it has been found by experiment that when laser crystallization is carried out in a vacuum or hydrogen gas, superior crystal can be obtained. Accordingly, in this embodiment, crystallization is carried out in the hydrogen gas of 10 Torr by the irradiation of the XeCl excimer laser (wavelength 308 nm, pulse width 30 nsec). The energy density of the laser is 250 mJ/cm$^2$ and fifteen shots are carried out.

Although heating of the substrate 2001 at the laser crystallization is effective for obtaining superior crystallization, if the substrate is heated up to an excessively high temperature, hydrogen in the amorphous active layer 2011 is drawn off. Accordingly, the crystallization is preferably to carry out at a temperature of not larger than 300° C. In this embodiment, the crystallization is carried out in the state where the substrate 2001 is heated up to 150° C.

After the crystallization is completed, an impurity semiconductor layer for source and drain regions and a wiring layer are formed without exposing the substrate to the atmosphere. The impurity semiconductor layer is formed by the plasma CVD method or low pressure CVD method using a mixture gas of a source gas for silicon and a trivalent or pentavalent impurity gas such as boron or phosphorous.

Thereafter, a conductive film for the wiring layer is formed. As the conductive film, a metal film or a transparent conductive oxide film of ITO or the like is used. After forming the impurity semiconductor layer and the wiring layer, by using the photolithographic technique, a source region 2030, a drain region 2031, a source electrode 2040, and a drain electrode 2041 are formed.

A channel forming region is formed by etching a part of the active layer when the source and drain are formed. Then, a polysilicon channel region 2050 and an amorphous channel region 2051 are formed. The thickness of the active layer in the respective channel regions is slightly thinner than the source region 2030 and the drain region 2031 since the active layer is slightly etched when the source and drain are formed. In this way, the state as shown in FIG. 2(A) is obtained.

The left side in FIG. 2(A) is the polysilicon TFT, and the right side thereof is the amorphous silicon TFT. Although they are formed to be adjacent to each other in the drawing, the polysilicon TFT is practically formed on a portion of the substrate where a driving circuit is formed, and the amorphous TFT is formed on a portion thereof where a switching element for a pixel is formed.

Figure 2B:
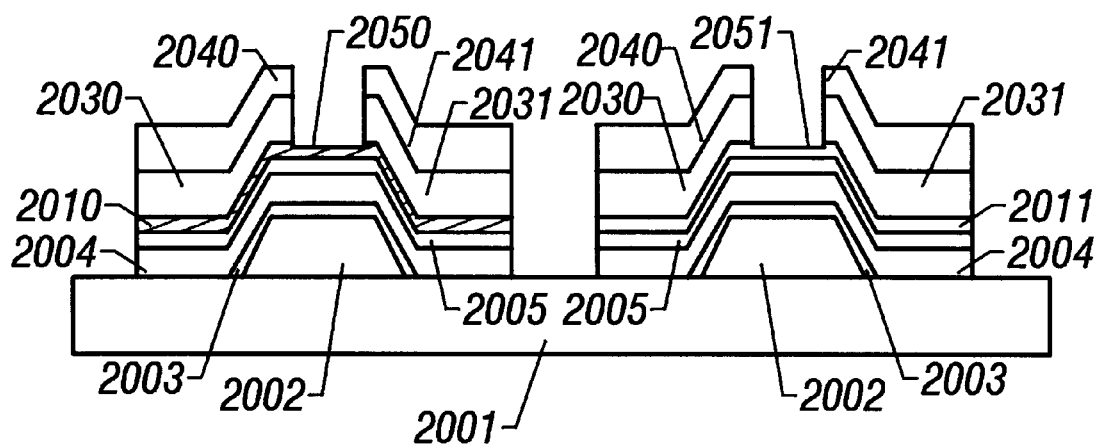

FIG. 2(B) shows a modified embodiment almost equal to FIG. 2(A) in the process and structure. Reference numerals in FIG. 2(B) correspond to those in FIG. 2(A). The only difference is that a gate insulating film is formed of two layers, that is, a first gate insulating film 2004 and a second gate insulating film 2005 are provided.

Although it has been found by experiment that in the amorphous silicon TFT, a silicon nitride film is preferable as the gate insulating film being contact with a channel forming region made of amorphous silicon. However, since the relative dielectric constant of the silicon nitride film is about as two time as large as that of the silicon oxide film, the thickness thereof becomes thick. Thus, when only the portion being contact with the amorphous silicon is formed of the silicon nitride film, and other portion is formed of the silicon oxide film, the film thickness of the entire gate insulating film can be made thin.

In this modified embodiment, the silicon oxide film of 1,000 Å is formed as the first gate insulating film 2004 by the reactive sputtering method using only an oxygen gas, and the silicon nitride film of 50 Å is formed as the second gate insulating film 2005 by the photo CVD method using a mixture gas of silane, ammonium and nitrogen.

Third Embodiment

A manufacturing method of forming polysilicon TFTs and amorphous silicon TFTs on the same substrate by using the present invention will be described.

Figure 3A:
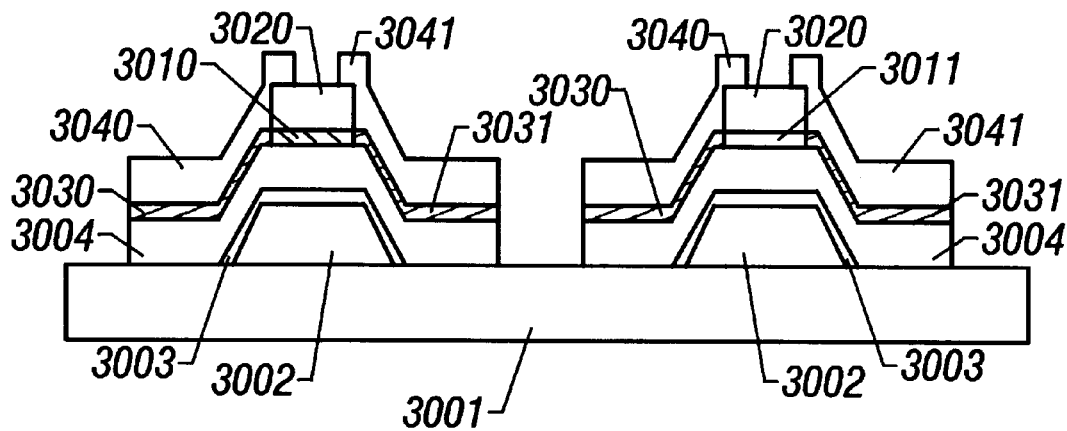
FIGS. 3(A) and 3(B) are views showing transistors of the present invention.

FIG. 3(A) shows a third embodiment of the present invention. A substrate 3001 has an insulating surface and it is made of an insulator such as soda glass, borosilicate glass or quartz, one coated with a PSG film, silicon oxide film or silicon nitride film, or the like. This embodiment uses a substrate of 7059 glass produced by Corning Co., Ltd. as the borosilicate glass, coated with a silicon oxide film by sputtering.

After forming a conductive film for a gate electrode 3002 on the substrate 3001, it is formed into a desired shape by using a photolithographic technique to obtain the gate electrodes 3002. At this formation, since a subsequently formed active layer is thin to be 100 to 300 Å, the gate electrode must be formed so that the cross section thereof is taper-shaped as shown in the drawing. As the material of the gate electrode 3002, there is used metal such as tantalum, chromium, molybdenum, or aluminum. If possible, it is preferable to use such metal that the surface thereof can be subjected to anodic oxidation using an anodic oxidation technique. In this embodiment, after forming an aluminum film, a gate AO film 3003 is formed by the anodic oxidation.

Although the anodic oxidation film is not necessarily required, in view of heat resistance in a subsequent laser crystallization or the like and to prevent a leak between a gate electrode and a drain or source of the amorphous silicon TFT, it is preferable to carry out the anodic oxidation.

When an aluminum film is formed, since a subsequent heat process is apt to cause hillocks so that the leak between the gate electrode and the drain or source is generated, the film formation must be inventively conducted.

When a pure aluminum film is formed under a background pressure by sufficient evacuation, the hillocks are hard to be generated. Thus, if the film formation is carried out after the pressure is made not larger than $10^{-7}$ Torr, the generation of hillocks can be greatly reduced. Also, if silicon or scandium of 0.1 to 2% is mixed into aluminum, the generation of hillocks can be greatly reduced.

In this embodiment, the aluminum film is formed by using an ultra high vacuum sputtering apparatus to prevent the hillocks from being generated. In this sputtering apparatus, all inner walls of a film forming chamber are subjected to electrolytic polishing, and a turbo molecular pump and a cryopump are provided to make the background pressure not larger than $10^{-7}$ Torr, so that the background pressure can be reduced to about $5 \times 10^{-8}$ Torr. Further, an argon gas to be introduced is used after refining at a use point of the apparatus. Although the film thickness of the gate electrode 3002 is about 1,000 to 3,000 Å, the film thickness of 500 Å is sufficient for aluminum which requires such a film thickness that a sheet resistance is not larger than 1 Ω/•. However, in order to further reduce the resistance, the thickness in this embodiment is 1,500 Å.

After forming the gate electrode 3002 and the gate AO film 3003, a gate insulating film 3004 is formed. As the gate insulating film 3004, there is used a single layer or a multilayer of a silicon nitride film, silicon oxide film, or silicon nitride oxide film. As a film forming method, a plasma CVD method is used. In this embodiment, the silicon nitride film is formed by a parallel flat plate plasma CVD method. The film thickness of the gate insulating film 3004 is comparable to or larger than that of the gate electrode 3002. In this embodiment, the silicon nitride film of 3,000 Å is formed.

After forming the gate insulating film 3004, an amorphous silicon film as an active layer for forming a channel forming region and source region and drain regions is formed. Unless the amorphous silicon film is formed without exposing it to the atmosphere after the formation of the gate insulating film 3004, a number of interface states are generated in the interface between the gate insulating film 3004 and the active layer so that a superior transistor can not be formed.

Accordingly, continuous film formation of forming a film without breaking a vacuum is important.

As methods of forming the active layer, there are a plasma CVD method, a low pressure CVD method, a photo CVD method, a sputtering method, and the like. In this embodiment, the sputtering method is used. In the sputtering, reactive sputtering by a mixture gas of argon and hydrogen is carried out, so that the amorphous silicon film with a thickness of 100 to 300 Å is formed as the active layer. This is because when the thickness is not larger than 100 Å, crystallization by a laser or the like is hard, and when the thickness is not less than 300 Å, an OFF-state leak current of the TFT becomes large. In this embodiment, the amorphous silicon of about 200 Å is formed by the reactive sputtering.

After forming the active layer, portions where polysilicon TFTs are required for subsequent formation of driving circuits or the like are crystallized. The active layer is partially crystallized by irradiation of an excimer laser having a wavelength of not larger than 400 nm such as an ArF or XeCl excimer laser, so that a polysilicon active layer 3010 and an amorphous active layer 3011 not crystallized are formed. Since it has been found by experiment that when laser crystallization is carried out in a vacuum or hydrogen, superior crystal can be obtained accordingly, in this embodiment, crystallization is carried out in the vacuum of $10^{-5}$ Torr by irradiation of the KrF excimer laser (wavelength 248 nm, pulse width 20 nsec). The energy density of the laser is 300 mJ/cm² and ten shots are carried out.

Although heating of the substrate 3001 at the laser crystallization is effective for obtaining superior crystallization, if the substrate is heated up to an excessively high temperature, hydrogen in the amorphous active layer 3011 is drawn off. Accordingly, the crystallization is preferably carried out at a temperature of not larger than 300° C. In this embodiment, the crystallization is carried out in the state where the substrate 3001 is heated up to 150° C.

After crystallization is completed, an insulating film as an etching stopper 3020 is formed without exposing the substrate to the atmosphere. Any insulating films may be used as long as they assure a selection ratio with respect to silicon at subsequent etching. Silicon oxide, silicon nitride, silicon nitride oxide, or the like is used. In this embodiment, the silicon nitride film of 1,000 Å by the plasma CVD method is formed.

After forming the insulating film for the etching stopper 3020, the substrate 3001 is taken out into the atmosphere. With respect to the substrate 3001 taken out into the atmosphere, the insulating film for the etching stopper 3020 is etched by a photolithographic technique to form the etching stopper 3020. This etching stopper 3020 determines a channel forming region of the TFT. As shown in the drawing, the etching stopper is formed so that the width thereof is narrower than that of the gate electrode 3002. Next, by using the photolithographic technique, the active layer and the gate insulating film 3004 are formed into desired shapes. In this embodiment, although the active layer and the gate insulating film 3004 are formed into the same shape, it is not required actually to form them into the same shape.

Next, impurities are doped into the source and drain regions by ion doping or ion implantation. In this embodiment, doping is carried out by the ion doping. The ion doping is a method in which impurity doping is carried out without mass separation. When doping of phosphorous is carried out, PH3 is decomposed by plasma and is accelerated as it is, so that doping is carried out into the source and drain regions of the active layer. At this time, P ions and PH ions have no problem. However, since H ions easily pass through a film, an accelerating voltage must be controlled so that the H ions do not reach the channel forming region under the etching stopper 3020.

By experiments, hydrogen ions by acceleration of 10 KeV intrude into the silicon nitride film so that the peak of a doping amount exists at the depth of about 1,800 Å. On the other hand, phosphorous ions by the same acceleration of 10 KeV has the peak of a doping amount at the depth of about 300 Å. Accordingly, in this embodiment, doping is carried out by acceleration of 10 KeV at the dose amount of $5 \times 10_{14}$ to $5 \times 10_{15}$ atom/cm².

According to this doping, a source region 3030 and a drain region 3031 are formed. Thereafter, a conductive film for a wiring layer is formed. As the conductive film, a metal film or a transparent conductive oxide film of ITO or the like is used. After forming the wiring layer, by using the photolithographic technique, a source electrode 3040 and a drain electrode 3041 are formed so that the state shown in FIG. 3(A) is obtained. In the drawing, although the source and drain electrodes are shaped so that they extend to the upper portion of the etching stopper 3020, this is not necessarily required in this embodiment. An interlayer insulating film having contact holes may be formed so that the source electrode 3040 and the source region 3030 are brought into contact with each other through the contact hole, and the drain electrode 3041 and the drain region 3031 may be brought into contact with each other through the contact hole.

When the ion doping is carried out, the crystallinity of the doped portion is lost so that the portion is converted into the amorphous state. Accordingly, similar to the case where partial crystallization is carried out, laser crystallization is again conducted. In this case, since the channel forming portion is covered with the etching stopper 3020, the power of a laser and the number of shots can be easily increased to facilitate the crystallization.

The left side in FIG. 3(A) is the polysilicon TFT, and the right side thereof is the amorphous silicon TFT. Although they are formed to be adjacent to each other in the drawing, the polysilicon TFT is practically formed on a portion of the substrate where a driving circuit is formed, and the amorphous TFT is formed on a portion thereof where a switching element for a pixel is formed.

Figure 3B:
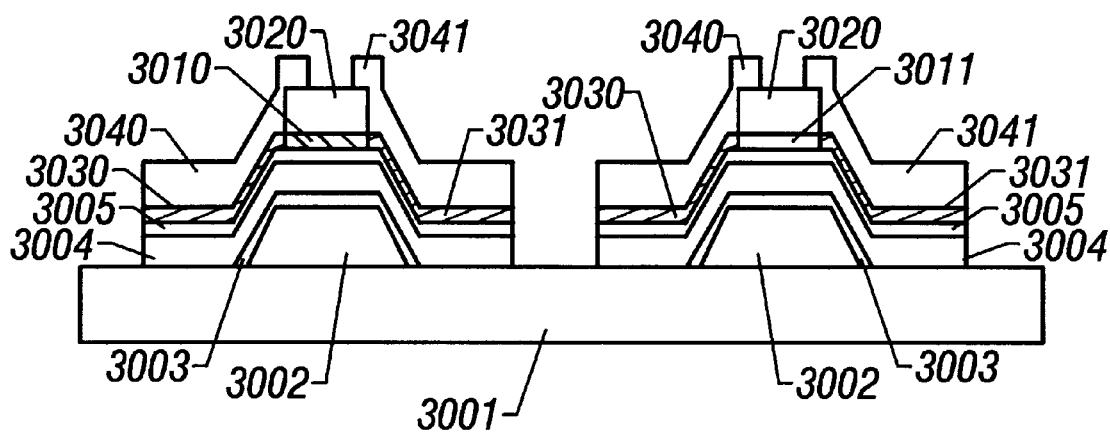

FIG. 3(B) shows a modified embodiment almost equal to FIG. 3(A) in the process and structure. Reference numerals in FIG. 3(B) correspond to those in FIG. 3(A). Only difference is that a gate insulating film is formed of two layers, that is, a first gate insulating film 3004 and a second gate insulating film 3005 are provided.

Although it has been found by experiment that in the amorphous silicon TFT, a silicon nitride film is preferable as the gate insulating film being contact with the channel forming region made of amorphous silicon. However, since the relative dielectric constant of the silicon nitride film is about as two times as large as that of the silicon oxide film, the thickness thereof becomes large. Thus, when only the portion being contact with the amorphous silicon is formed of the silicon nitride film, and other portion is formed of the silicon oxide film, the film thickness of the entire gate insulating film can be made thin.

In this embodiment, the silicon oxide film of 1,000 Å is formed as the first gate insulating film 3004 by the plasma CVD method using organic silane, and the silicon nitride film of 50 Å is formed as the second gate insulating film 3005 by the plasma CVD method using a mixture gas of silane, ammonium and nitrogen.

Fourth Embodiment

Figure 4A:
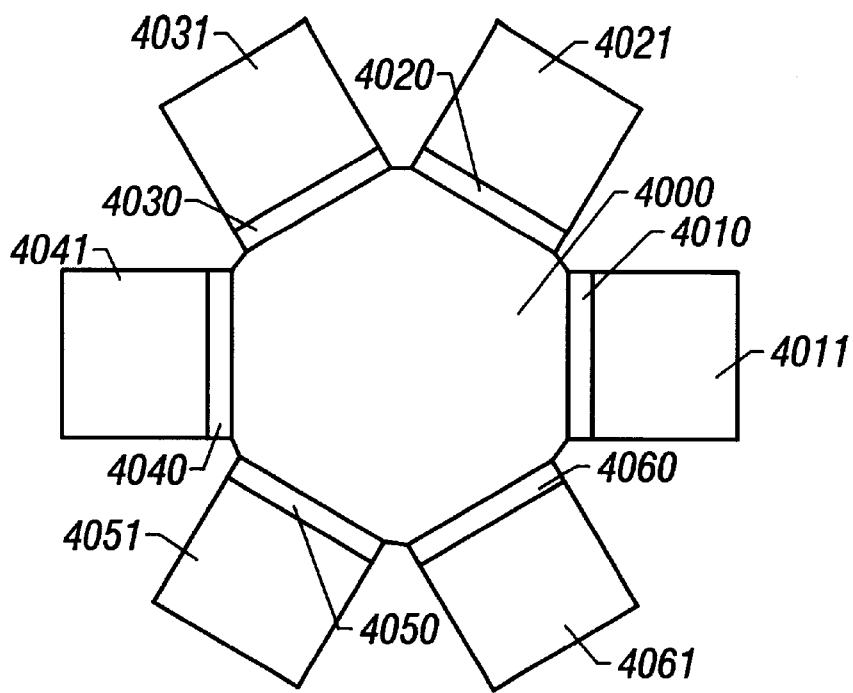
FIGS. 4(A) and 4(B) are views showing an apparatus for practicing the present invention.

Next, an example of a manufacturing apparatus for practicing the present invention will be described. FIG. 4(A) shows an apparatus for forming a gate insulating film, forming an active layer, crystallizing the active layer, and forming an insulating film for an etching stopper after formation of a gate electrode without exposing the gate electrode to the atmosphere. Since all steps are carried out under a low pressure, the apparatus is formed into the structure of a multi-chamber type vacuum apparatus.

A common chamber 4000 including a robot for transferring a substrate and connected to chambers for the respective steps is always in a low pressure state. The common chamber 4000 is connected to the chambers for the respective steps through the respective gates. A load chamber 4011 and a load chamber gate 4010 are disposed, and a plurality of substrates can be set in the load chamber 4011, which has been opened to the atmosphere, under the state where the substrates are contained in a cassette. After setting the substrates, the load chamber 4011 is made into a low pressure state. When a predetermined pressure is attained, the load chamber gate 4010 is opened and the robot in the common chamber 4000 transfers the substrates one after another into the common chamber 4000.

The transferred substrates are next transferred into a gate insulating film forming chamber 4021. A gate insulating film forming chamber gate 4020 is opened, and after the substrates are transferred into the gate insulating film forming chamber, the gate 4020 is closed. In the formation of an insulating film, there may be used various methods such as plasma CVD method, LPCVD method using lamp heating, sputtering method, and photo CVD method. In this embodiment, both the plasma CVD method and the photo CVD method can be carried out in the film formation chamber.

After the film is formed in the gate insulating film forming chamber 4021, the substrates are transferred into an active layer forming chamber 4031. The active layer forming chamber 4031 is connected to the common chamber 4000 through an active layer forming chamber gate 4030. When the substrates go in and out the chamber, the active layer forming chamber gate 4030 opens and closes. In the film formation in the active layer forming chamber 4031, there may be used various methods such as plasma CVD method, LPCVD method using lamp heating, sputtering method, and photo CVD method. In this embodiment, the active layer is formed by the reactive sputtering. A single crystal silicon wafer is used as a target for sputtering, and a sputtering gas is a mixture gas of argon and hydrogen. In the sputtering chamber, the substrates are treated one after another.

Next, the substrates are transferred into a crystallizing chamber 4041. The crystallizing chamber 4041 is connected to the common chamber 4000 through a crystallizing chamber gate 4040. When the substrates go in and out the chamber, the crystallizing chamber gate 4040 opens and closes. The active layer of amorphous silicon of 100 ⊂ to 300 is partially crystallized using a laser or lamp.

Next, the substrates are transferred into an etching stopper chamber 4051. The etching stopper chamber 4051 is connected to the common chamber 4000 through an etching stopper chamber gate 4050.

When the substrates go in and out the chamber, the etching stopper chamber gate 4050 opens and closes. An insulating film for an etching stopper is formed in the etching stopper chamber 4051. There are various methods such as plasma CVD method, LPCVD method using lamp heating, sputtering method, and photo CVD method. In this embodiment, the etching stopper insulating film is formed by the plasma CVD.

Next, the substrates are transferred into an unload chamber 4061. The unload chamber 4061 is connected to the common chamber 4000 through an unload chamber gate 4060. When the substrates go in and out the chamber, the unload chamber gate 4060 opens and closes. A cassette for containing the substrates is disposed in the unload chamber 4061, and the substrates subjected to all the respective steps without being exposed to the atmosphere are put into the cassette. When the number of the substrates contained in the cassette reaches a predetermined number, the unload chamber 4061 is opened to the atmosphere and the substrates are taken out.

Figure 4B:
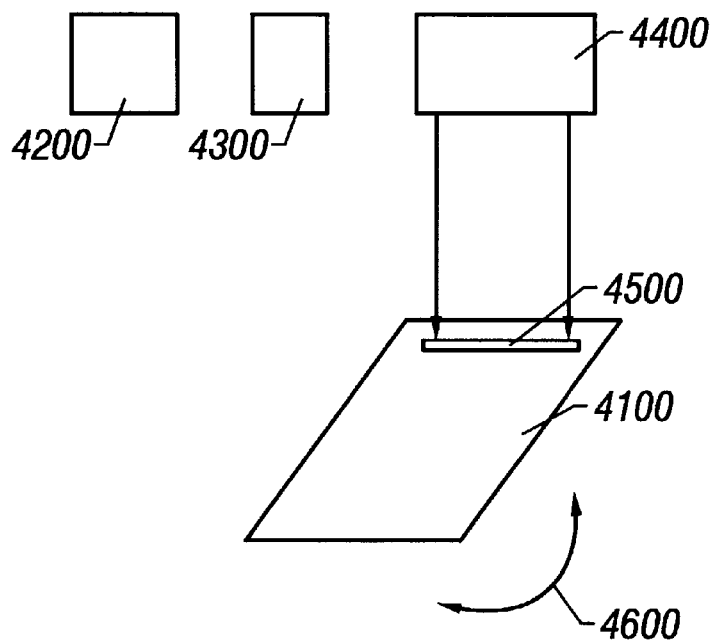

FIG. 4(B) shows a method of partially crystallizing the substrate. A laser oscillator 4200, a homogenizer 4300, and an optical system 4400 are disposed for the substrate 4100. An excimer laser oscillator of KrF, XeCl or the like is used as the laser oscillator 4200. A laser beam from the oscillator is made to have a uniform energy surface by the homogenizer 4300, and is shaped into a linear laser beam 4500 through the optical system 4400.

A portion of the substrate 4100 where crystallization is desired is one where a polysilicon TFT such as a driving circuit is required, and the portion is the vicinity of the end of the substrate 4100. Accordingly, if the substrate 4100 is rotated by 90° as shown by arrow 4600, only necessary portions can be crystallized.

Figure 5A:
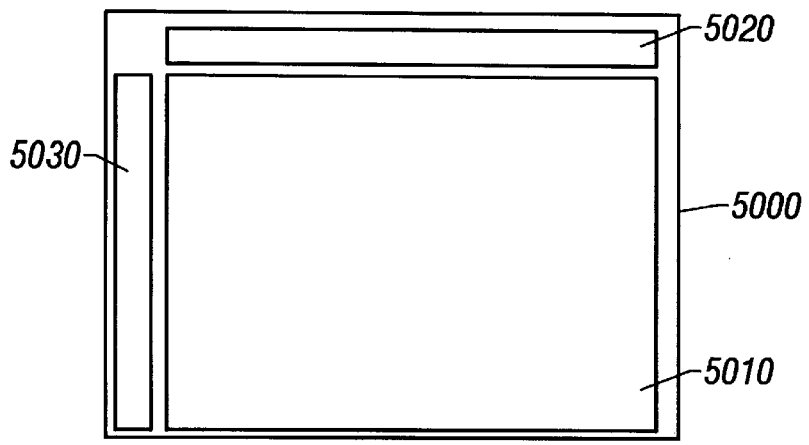
FIGS. 5(A) to 5(C) are views showing steps of laser crystallization of the present invention.
Figure 5B:
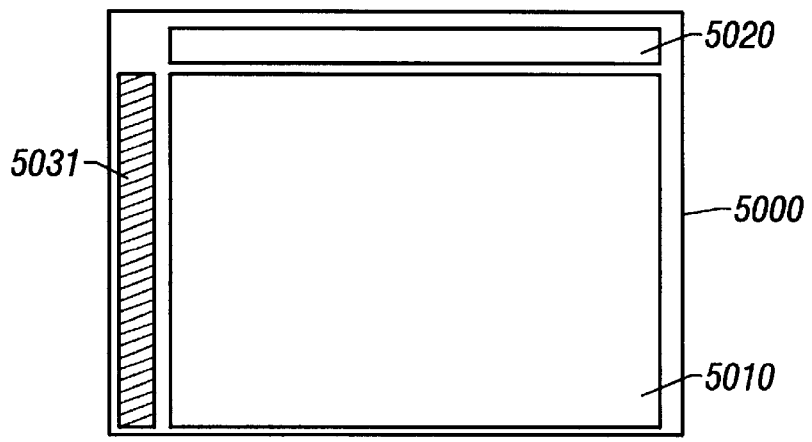
Figure 5C:
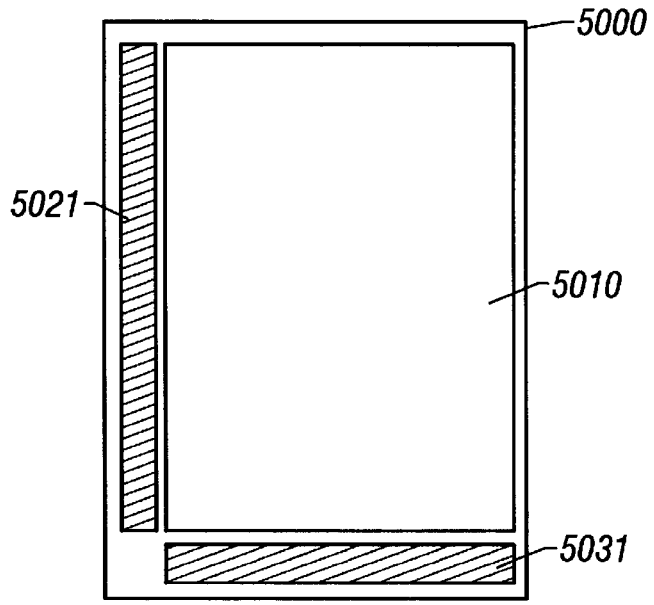

More specifically, the portion where the polysilicon TFT is required is as shown in FIGS. 5(A) to 5(C). An amorphous silicon as an active layer is formed on the entire surface of a substrate 5000, and includes a pixel region 5010, a source driver region 5020 mainly comprised of a shift register, buffer circuit, analog memory and the like, and a gate driver region 5030 mainly comprised of a shift register.

The pixel region 5010 is a region where amorphous TFTs are formed. The source driver region 5020 and the gate driver region 5030 are regions where polysilicon TFTs are formed, and these are regions where the substrate 5000 is partially crystallized. The irradiation of an excimer laser beam shaped into a linear laser beam is first carried out to the gate driver region 5030 so that this region 5030 is converted into a polysilicon gate driver region 5031. Next, the substrate is rotated by 90° and the irradiation of the excimer laser beam is carried out to the source driver region 5020 to form a polysilicon source driver region 5021 so that the partial crystallization is completed.

Various kinds of circuit such as a shift register, buffer circuit, and analog memory are formed in the source driver region. When laser crystallization is carried out, if the entire region is crystallized at once, there is no problem. However, when crystallization is carried out by repeating division irradiation in the source driver region, it has been found by experiment that irregularity of characteristics of transistors is small when division is carried out for the respective circuits, not for places on the substrate. This is because the oscillator of the excimer laser was not stable at the time when the present invention was made. Since it is preferable that the characteristics of crystallized silicon is uniform in the same circuit, it is necessary to design the circuit arrangement so that irradiation can be carried out for the respective circuits. It is supposed that if the oscillator of the excimer laser becomes stable, such a problem becomes less serious.

Figure 6A:
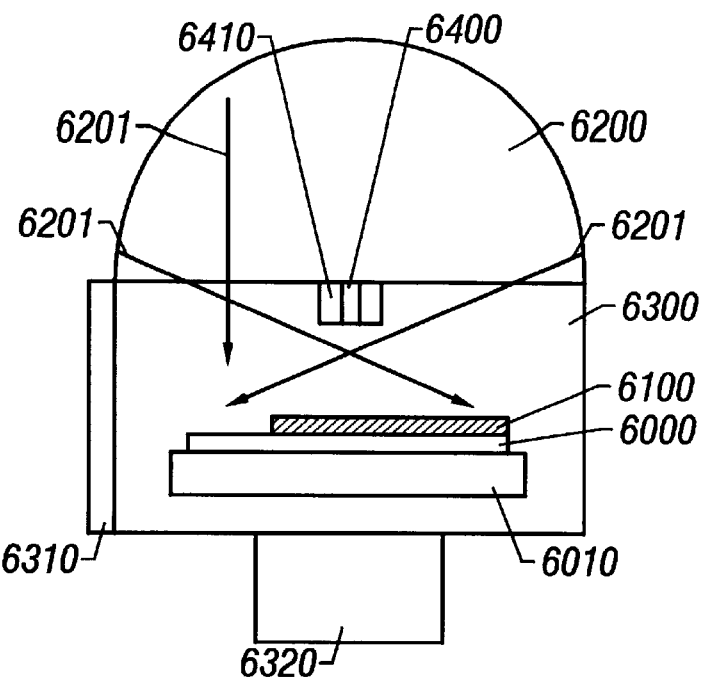
FIGS. 6(A) and 6(B) are views showing an apparatus for practicing the present invention.

FIG. 6 shows an apparatus for carrying out the partial crystallization of the invention under a low pressure. FIG. 6(A) shows an example of using lamp heating. A substrate 6000 is placed on a substrate holder 6010, and a mask 6100 is disposed over the substrate 6000. A lamp chamber 6200 is dome-shaped, and a halogen lamp is set.

An inner wall of the chamber is covered with a reflective plate so that the substrate is irradiated with the light from the lamp. The light is reflected as shown by arrows 6201 and then applied or directly applied to the substrate. A gate 6310 and a vacuum pump 6320 are connected to a crystallizing chamber 6300, and a nozzle 6400 and a nozzle cover 6410 for introducing a gas such as hydrogen are disposed in the crystallizing chamber 6300.

The halogen lamp has an output of 1,000 to 3,000 W so that it can instantaneously crystallize the amorphous silicon on the substrate 6000. A portion where crystallization is not desired is covered with a mask 6100, and the portion is not irradiated with the lamp light so that it is not crystallized. In view of curvature, it is preferable to use fine ceramics as a material of the mask 6100. In this embodiment, an aluminum plate is used.

Figure 6B:
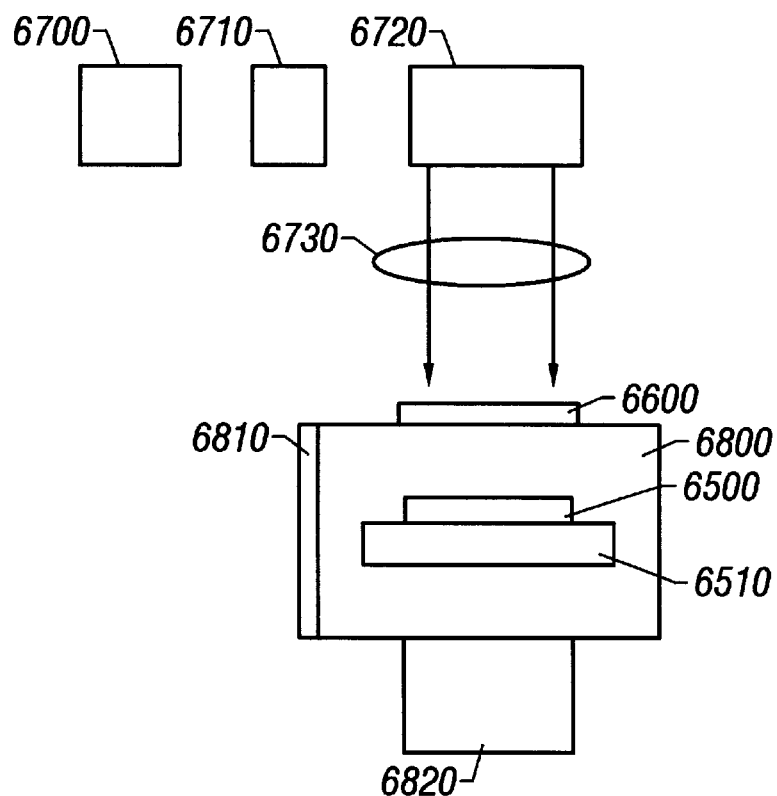

FIG. 6(B) shows an example using a laser. A substrate 6500 is placed on a substrate holder 6510 and is placed in a crystallizing chamber 6800. A gate 6810 and a vacuum pump 6820 are connected to the crystallizing chamber 6800. Further, a window 6600 for making a laser beam pass through is attached to the chamber 6800. The window 6600 is made of quartz or synthetic quartz, and is designed to allow the wavelength of not larger than 400 nm to pass through. A laser oscillator 6700, a homogenizer 6710, and an optical system 6720 are disposed outside the crystallizing chamber 6800 so that the laser beam can be shaped into a linear beam 6730.

When the crystallizing chamber as shown in FIGS. 6(A) or 6(B) is used as one of multi-chamber processing chambers as shown in FIG. 4(A), formation of the insulating gate film, formation of the active layer, partial crystallization of the active layer, and formation of the etching stopper film can be continuously carried out. Also, if an impurity semiconductor film forming chamber and a conductive film forming chamber are provided instead of the film forming chamber of the etching stopper film, it is possible to carry out a step as shown in FIG. 2 in which the channel forming region is slightly etched.

According to the present invention, the amorphous silicon TFT and polysilicon TFT of bottom gate type and reverse stagger type can be formed on the same substrate. Accordingly, a driver circuit having large frequency characteristics and also capable of being formed into a complementary type can be made by forming a driver circuit portion of polysilicon, and at the same time, a switching element having a small OFF-state leak current can be fabricated by the amorphous silicon TFT for a pixel portion.

Further, when process chambers of the respective steps are disposed in the multi-chamber, almost all portions of a transistor can be formed without being exposed to the atmosphere. Thus, the characteristics of the transistor can be improved. When crystallization is carried out using a laser, partial crystallization can be easily carried out by rotating the substrate by 90°. When crystallization is carried out by using a lamp, partial crystallization can be easily carried out by using a mask. Accordingly, the present invention is of high utility value in technology.

What is claimed is:

1. A semiconductor device comprising:
   at least one first thin film transistor formed over a substrate;
   a driving circuit comprising at least one second thin film transistor formed over said substrate, said second thin film transistor comprising:
      a gate electrode comprising chromium formed over the substrate where in said gate electrode has tapered side edges;
      a gate insulating film formed on said gate electrode;
      a semiconductor film comprising crystalline silicon formed on said gate insulating film where in said semiconductor film includes a channel forming region over said gate electrode, and a pair of impurity doped regions with the channel forming region interposed therebetween,
      wherein said semiconductor film has a thickness in a range from 100 to 300 Å.

2. A semiconductor device according to claim 1 wherein said substrate is selected from the group consisting of soda glass, borosilicate glass and quartz.

3. A semiconductor device according to claim 1 wherein said substrate is an insulating substrate coated with a film comprising a material selected from the group consisting of PSG, silicon oxide, and silicon nitride.

4. A semiconductor device according to claim 1 wherein said gate insulating film has a multi-layer structure including at least a first layer comprising silicon oxide and a second layer comprising silicon nitride, and said second layer is in contact with said semiconductor film.

5. A semiconductor device according to claim 1 wherein said semiconductor film is formed by a method comprising steps of depositing an amorphous semiconductor film on said gate insulating film and crystallizing said amorphous semiconductor film by irradiation of pulsed excimer laser beam.

6. A semiconductor device according to claim 1 wherein an insulating film is formed on said channel forming region as an etching stopper.

7. A semiconductor device according to claim 1 wherein said gate insulating film has a thickness within a range from 1000 to 3000 Å.

8. A semiconductor device according to claim 1 wherein said semiconductor film is formed without exposing a surface of said gate insulating film after the formation of said gate insulating film.

9. A semiconductor device according to claim 1 wherein said semiconductor device is an active matrix liquid crystal display device.

10. A semiconductor device comprising:
    at least one first thin film transistor formed in a pixel portion over a substrate;
    a driving circuit including at least one circuit selected from the group consisting of a shift register, a buffer circuit and an analog memory, said circuit comprising at least one second thin film transistor formed over said substrate, said second thin film transistor comprising:
       a gate electrode comprising chromium formed over the substrate, wherein said gate electrode has tapered side edges;
       a gate insulating film formed on said gate electrode;
       a semiconductor film comprising crystalline silicon formed on said gate insulating film wherein said semiconductor film includes a channel forming region over said gate electrode, and a pair of impurity doped regions with the channel forming region interposed therebetween, wherein said substrate has a level upper surface.

11. A semiconductor device according to claim 10 wherein said substrate is selected from the group consisting of soda glass, borosilicate glass and quartz.

12. A semiconductor device according to claim 10 wherein said substrate is an insulating substrate coated with a film comprising a material selected from the group consisting of PSG, silicon oxide, and silicon nitride.

13. A semiconductor device according to claim 10 wherein said gate insulating film has a multi-layer structure including at least a first layer comprising silicon oxide and a second layer comprising silicon nitride, and said second layer contacts said semiconductor film.

14. A semiconductor device according to claim 10 wherein said semiconductor film is formed by a method comprising steps of depositing an amorphous semiconductor film on said gate insulating film and crystallizing said amorphous semiconductor film by irradiation of pulsed excimer laser beam.

15. A semiconductor device according to claim 10 wherein an insulating film is formed on said channel forming region as an etching stopper.

16. A semiconductor device according to claim 10 wherein said gate insulating film has a thickness within a range from 1000 to 3000 Å.

17. A semiconductor device according to claim 10 wherein said semiconductor film is formed without exposing a surface of said gate insulating film after the formation of said gate insulating film.

18. A semiconductor device according to claim 10 wherein said semiconductor device is an active matrix liquid crystal display device.

19. A semiconductor device having at least one thin film transistor, said thin film transistor comprising:
    a gate electrode formed over a substrate wherein said gate electrode has tapered side edges;
    a gate insulating film formed on said gate electrode;
    a semiconductor film comprising crystalline silicon formed on said gate insulating film wherein said semiconductor film includes a channel forming region over said gate electrode, a pair of impurity regions with the channel forming region interposed therebetween and at least one lightly doped region interposed between said channel forming region and one of said pair of impurity regions wherein said lightly doped region is doped with an impurity at a lower concentration than said pair of impurity regions, wherein said gate insulating film has a multi-layer structure including at least a first layer comprising silicon oxide and a second layer comprising silicon nitride, and said second layer contacts said semiconductor film.

20. A semiconductor device according to claim 19 wherein said substrate is selected from the group consisting of soda glass, borosilicate glass and quartz.

21. A semiconductor device according to claim 19 wherein said substrate is an insulating substrate coated with a film comprising a material selected from the group consisting of PSG, silicon oxide, and silicon nitride.

22. A semiconductor device according to claim 19 wherein said semiconductor film is formed by a method comprising steps of depositing an amorphous semiconductor film on said gate insulating film and crystallizing said amorphous semiconductor film by irradiation of pulsed excimer laser beam.

23. A semiconductor device according to claim 19 wherein an insulating film is formed on said channel forming region as an etching stopper.

24. A semiconductor device according to claim 19 wherein said gate insulating film has a thickness within a range from 1000 to 3000 Å.

25. A semiconductor device according to claim 19 wherein said semiconductor device is an active matrix liquid crystal display device.

26. A semiconductor device comprising:
at least one first thin film transistor formed in a pixel portion over a substrate;
a driving circuit comprising at least one second thin film transistor formed over said substrate, said second thin film transistor comprising:
a gate electrode formed over the substrate wherein said gate electrode has tapered side edges;
a gate insulating film formed on said gate electrode;
a semiconductor film comprising crystalline silicon formed on said gate insulating film wherein said semiconductor film includes a channel forming region over said gate electrode, a pair of impurity regions with the channel forming region interposed therebetween and at least one lightly doped region interposed between said channel forming region and one of said pair of impurity regions wherein said lightly doped region is doped with an impurity at a lower concentration than said pair of impurity regions,
wherein said semiconductor film has a thickness of 100 to 300 Å.

27. A semiconductor device according to claim 26 wherein said substrate is selected from the group consisting of soda glass, borosilicate glass and quartz.

28. A semiconductor device according to claim 26 wherein said substrate is an insulating substrate coated with a film comprising a material selected from the group consisting of PSG, silicon oxide, and silicon nitride.

29. A semiconductor device according to claim 26 wherein said gate insulating film has a multi-layer structure including at least a first layer comprising silicon oxide and a second layer comprising silicon nitride, wherein said second layer is in contact with said semiconductor film.

30. A semiconductor device according to claim 26 wherein said semiconductor film is formed by a method comprising steps of depositing an amorphous semiconductor film on said gate insulating film and crystallizing said amorphous semiconductor film by irradiation of pulsed excimer laser beam.

31. A semiconductor device according to claim 26 wherein an insulating film is formed on said channel forming region as an etching stopper.

32. A semiconductor device according to claim 26 wherein said gate insulating film has a thickness within a range from 1000 to 3000 Å.

33. A semiconductor device according to claim 26 wherein said semiconductor device is an active matrix liquid crystal display device.

34. A semiconductor device comprising:
at least one first thin film transistor formed in a pixel portion over a substrate;
a driving circuit including at least one circuit selected from the group consisting of a shift register, a buffer circuit and an analog memory, said circuit comprising a plurality of second thin film transistors formed over said substrate, at least one of said second thin film transistors comprising:
a gate electrode formed over the substrate wherein said gate electrode has tapered side edges;
a gate insulating film formed on said gate electrode;
a semiconductor film comprising crystalline silicon formed on said gate insulating film wherein said semiconductor film includes a channel forming region over said gate electrode, a pair of impurity regions with the channel forming region interposed therebetween and at least one lightly doped region interposed between said channel forming region and one of said pair of impurity regions wherein said lightly doped region is doped with an impurity at a lower concentration than said pair of impurity regions,
wherein said semiconductor film has a thickness of 100 to 300 Å.

35. A semiconductor device according to claim 34 wherein said substrate is selected from the group consisting of soda glass, borosilicate glass and quartz.

36. A semiconductor device according to claim 34 wherein said substrate is an insulating substrate coated with a film comprising a material selected from the group consisting of PSG, silicon oxide, and silicon nitride.

37. A semiconductor device according to claim 34 wherein said gate insulating film has a multi-layer structure including at least a first layer comprising silicon oxide and a second layer comprising silicon nitride,
wherein said second layer is in contact with said semiconductor film.

38. A semiconductor device according to claim 34 wherein said semiconductor film is formed by a method comprising steps of depositing an amorphous semiconductor film on said gate insulating film and crystallizing said amorphous semiconductor film by irradiation of pulsed excimer laser beam.

39. A semiconductor device according to claim 34 wherein an insulating film is formed on said channel forming region as an etching stopper.

40. A semiconductor device according to claim 34 wherein said gate insulating film has a thickness within a range from 1000 to 3000 Å.

41. A semiconductor device according to claim 34 wherein said semiconductor device is an active matrix liquid crystal display device.

42. A semiconductor device comprising:
- at least one first thin film transistor formed in a pixel portion over a substrate;
- a driving circuit including at least one circuit selected from the group consisting of a shift register, a buffer circuit and an analog memory, said circuit comprising at least one second thin film transistors formed over said substrate, each of said first and second thin film transistors comprising:
  - a gate electrode formed over the substrate;
  - a gate insulating film formed over said gate electrode;
  - a semiconductor film formed on said gate insulating film, said semiconductor film including a channel forming region over said gate electrode, a pair of impurity regions with the channel forming region interposed therebetween, wherein said semiconductor film has a thickness of 100 to 300 Å,
  - wherein the channel forming region of said first thin film transistor comprises amorphous silicon while the channel forming region of said second thin film transistor comprises crystalline silicon.

43. A semiconductor device according to claim 42 wherein said substrate is selected from the group consisting of soda glass, borosilicate glass and quartz.

44. A semiconductor device according to claim 42 wherein said substrate is an insulating substrate coated with a film comprising a material selected from the group consisting of PSG, silicon oxide, and silicon nitride.

45. A semiconductor device according to claim 42 wherein said gate insulating film has a multi-layer structure including at least a first layer comprising silicon oxide and a second layer comprising silicon nitride, wherein said second layer is in contact with said semiconductor film.

46. A semiconductor device according to claim 42 wherein said gate insulating film has a thickness within a range form 1000 to 3000 Å.

47. A semiconductor device according to claim 42 wherein said semiconductor film of the second thin film transistor further includes at least one lightly doped region interposed between said channel forming region and one of said pair of impurity regions wherein said lightly doped region is doped with an impurity at a lower concentration than said pair of impurity regions.

48. A semiconductor device according to claim 42 wherein said semiconductor device is an active matrix liquid crystal display device.

49. A semiconductor device comprising:
- at least one first thin film transistor formed in a pixel portion over a substrate;
- a driving circuit including at least one circuit selected from the group consisting of a shift register, a buffer circuit and an analog memory, said circuit comprising at least one second thin film transistors formed over said substrate, each of said first and second thin film transistors comprising:
  - a gate electrode formed over the substrate;
  - a gate insulating film formed over said gate electrode;
  - a semiconductor film formed on said gate insulating film, said semiconductor film including a channel forming region over said gate electrode, a pair of impurity regions with the channel forming region interposed therebetween, wherein said semiconductor film has a thickness of 100 to 300 Å,
  - wherein the semiconductor film of said second thin film transistor has a higher degree of crystallinity than the semiconductor film of said first thin film transistor that is not crystallized.

50. A semiconductor device according to claim 49 wherein said substrate is an insulating substrate coated with a film comprising a material selected from the group consisting of PSG, silicon oxide, and silicon nitride.

51. A semiconductor device according to claim 49 wherein said gate insulating film has a multi-layer structure including at least a first layer comprising silicon oxide and a second layer comprising silicon nitride, wherein said second layer is in contact with said semiconductor film.

52. A semiconductor device according to claim 49 wherein said gate insulating film has a thickness within a range from 1000 to 3000 Å.

53. A semiconductor device according to claim 49 wherein said semiconductor film of the second thin film transistor further includes at lest one lightly doped region interposed between said channel forming region and one of said pair of impurity regions wherein said lightly doped region is doped with an impurity at a lower concentration than said pair of impurity regions.

54. A semiconductor device according to claim 49 wherein said semiconductor device is an active matrix liquid crystal display device.

55. A semiconductor device comprising:
- at least one first thin film transistor formed in a pixel portion over a substrate;
- a driving circuit comprising at least one second thin film transistor formed over said substrate, said second thin film transistor comprising:
  - a gate electrode comprising chromium formed over said substrate wherein said gate electrode has tapered side edges;
  - a gate-insulating film formed on said gate electrode; and
  - a semiconductor film comprising crystalline silicon formed on said gate insulating film wherein said semiconductor film includes a channel forming region over said gate electrode, a pair of impurity regions with said channel forming region interposed therebetween and at least one lightly doped drain region interposed between said channel forming region and one of said pair of impurity regions wherein said lightly doped region is doped with an impurity at a lower concentration than said pair of impurity region.

56. A semiconductor device according to claim 55 wherein said substrate is selected from the group consisting of soda glass, borosilicate glass and quartz.

57. A semiconductor device according to claim 55 wherein said substrate is an insulating substrate coated with a film comprising a material selected from the group consisting of PSG, silicon oxide, and silicon nitride.

58. A semiconductor device according to claim 55 wherein said gate insulating film has a multi-layer structure including at least a first layer comprising silicon oxide and a second layer comprising silicon nitride, wherein said second layer is in contact with said semiconductor film.

59. A semiconductor device according to claim 55 wherein said semiconductor film is formed by a method comprising steps of depositing an amorphous semiconductor film on said gate insulating film and crystallizing said amorphous semiconductor film by irradiation of pulsed excimer laser beam.

60. A semiconductor device according to claim 55 wherein an insulating film is formed on said channel forming region as an etching stopper.

61. A semiconductor device according to claim 55 wherein said gate insulating film has a thickness within a range from 1000 to 3000 Å.

62. A semiconductor device according to claim 55 wherein said semiconductor device is an active matrix liquid crystal display device.

63. A semiconductor device comprising:
- at least one first thin film transistor formed in a pixel portion over a substrate;
- a driving circuit including at least one circuit selected from the group consisting of a shift resister, a buffer circuit and an analog circuit memory, said circuit comprising a plurality of second thin film transistors formed over said substrate, at least one of said second thin film transistors comprising:
  - a gate electrode comprising chromium formed over said substrate wherein said gate electrode has tapered side edges;
  - a gate insulating film formed on said gate electrode; and
  - a semiconductor film comprising crystalline silicon formed on said gate insulating film wherein said semiconductor film includes a channel forming region over said gate electrode, a pair of impurity regions with said channel forming region interposed therebetween and at least one lightly doped drain region interposed between said channel forming region and one of said pair of impurity regions wherein said lightly doped region is doped with an impurity at a lower concentration than said pair of impurity region.

64. A semiconductor device according to claim 63 wherein said substrate is selected from the group consisting of soda glass, borosilicate glass and quartz.

65. A semiconductor device according to claim 63 wherein said substrate is an insulating substrate coated with a film comprising a material selected from the group consisting of PSG, silicon oxide, and silicon nitride.

66. A semiconductor device according to claim 63 wherein said gate insulating film has a multi-layer structure including at least a first layer comprising silicon oxide and a second layer comprising silicon nitride, wherein said second layer is in contact with said semiconductor film.

67. A semiconductor device according to claim 63 wherein said semiconductor film is formed by a method comprising steps of depositing an amorphous semiconductor film on said gate insulating film and crystallizing said amorphous semiconductor film by irradiation of pulsed excimer laser beam.

68. A semiconductor device according to claim 63 wherein an insulating film is formed on said channel forming region as an etching stopper.

69. A semiconductor device according to claim 63 wherein said gate insulating film has a thickness within a range from 1000 to 3000 Å.

70. A semiconductor device according to claim 63 wherein said semiconductor device is an active matrix liquid crystal display device.

* * * * *

UNITED STATES PATENT AND TRADEMARK OFFICE
CERTIFICATE OF CORRECTION

PATENT NO. : 6,204,519 B1
APPLICATION NO. : 08/813541
DATED : March 20, 2001
INVENTOR(S) : Takeshi Fukada, Toshiji Hamatani and Shunpei Yamazaki It is certified that error appears in the above-identified patent and that said Letters Patent is hereby corrected as shown below:

Column 9, line 28, replace "10Ω/·" with --10Ω/□--;

Column 12, line 38, replace "100" with --100 Å--;

Column 14, line 62, replace "100 å" with --100 Å--;

Column 21, line 18, replace "100 ⊂ to 300" with --100 Å to 300 Å--.

Signed and Sealed this
Twelfth Day of April, 2011

David J. Kappos
*Director of the United States Patent and Trademark Office*